United States Patent
Zhang et al.

(10) Patent No.: US 10,089,417 B2
(45) Date of Patent: Oct. 2, 2018

(54) STRUCTURE DETERMINATION IN A GEOGRAPHIC AREA

(71) Applicant: HERE Global B.V., Eindhoven (NL)

(72) Inventors: Xi Zhang, Chicago, IL (US); Xin Chen, Evanston, IL (US)

(73) Assignee: HERE Global B.V., Eindhoven (NL)

( * ) Notice: Subject to any disclaimer, the term of this patent is extended or adjusted under 35 U.S.C. 154(b) by 1203 days.

(21) Appl. No.: 14/038,322

(22) Filed: Sep. 26, 2013

(65) Prior Publication Data

US 2015/0088466 A1 Mar. 26, 2015

(51) Int. Cl.
G06F 17/50 (2006.01)
G06T 17/05 (2011.01)
G06T 19/00 (2011.01)

(52) U.S. Cl.
CPC .......... *G06F 17/5004* (2013.01); *G06T 17/05* (2013.01); *G06T 19/00* (2013.01)

(58) Field of Classification Search
CPC combination set(s) only.
See application file for complete search history.

(56) References Cited

U.S. PATENT DOCUMENTS

| | | | |
|---|---|---|---|
| 9,383,753 B1 * | 7/2016 | Templeton | G05D 1/0246 |
| 2014/0064624 A1 * | 3/2014 | Kim | G06T 7/0018 |
| | | | 382/201 |
| 2014/0095123 A1 * | 4/2014 | Patnaik | G06F 7/60 |
| | | | 703/2 |
| 2014/0211005 A1 * | 7/2014 | Dow | G01B 11/24 |
| | | | 348/144 |
| 2015/0143301 A1 * | 5/2015 | Reinhardt | G06F 3/04815 |
| | | | 715/848 |
| 2016/0253604 A1 * | 9/2016 | Degnan | G06Q 10/0631 |

OTHER PUBLICATIONS

Lafarge et al. Creating Large-Scale City Models from 3D-Point Clouds: A Robust Approach with Hybrid Representation Int J Comput Vis, 2012, pp. 69-85.*
Vosselman et al. 3D Building Model Reconstruction from Point Clouds and Ground Plans International Archives of Photogrammetry and Remote Sensing, vol. XXXIV-3/W4, Oct. 22-24, 2001.*
Vosselman et al. Recognising Structure in Laser Scanner Point Clouds International Archives of Photogrammetry, Remote Sensing and Spatial Information Sciences, 2004.*
Brostow et al. Segmentation and Recognition Using Structure from Motion Point Clouds ECCV, 2008, LNCS 5302, 2008, pp. 44-57.*
Lafarge et al. Creating Large-Scale City Models from 3D-Point Clouds: A Robust Approach with Hybrid Representation Int J Comput Vis, 2012, pp. 69-85).*
Henry Multivariate Receptor Modeling by N-Dimensional Edge Detection Chemometrics and Intelligent Laboratory Systems 65, 2003, pp. 179-189.*

(Continued)

*Primary Examiner* — Omar F Fernandez Rivas
*Assistant Examiner* — Cuong V Luu
(74) *Attorney, Agent, or Firm* — Alston & Bird LLP

(57) ABSTRACT

Structure boundaries may be determined by receiving a plurality of three dimensional (3D) data points representing a geographic area. The 3D data points may be projected into a two dimensional (2D) grid comprised of area elements. A structure boundary may be determined based on an analysis of the area elements.

17 Claims, 4 Drawing Sheets

(56) References Cited

OTHER PUBLICATIONS

Brostow et al. Segmentation and Recognition Using Structure from Motion Point Clouds, ECCV, 2008, LNCS 5302, 2008, pp. 44-57.*

Alexa et al., Computing and Rendering Point Set Surfaces, Jan. 2003, IEEE TVCG.

Besk et al., A Method for Registration of 3-D Shapes, Feb. 1992, vol. 14, No. 2, IEEE Transactions on Pattern Analysis and Machine Intelligence.

Castillo et al., Point Cloud Segmentation via Constrained Nonlinear Least Squares Surface Normal Estimates, 2009, Recent UCLA Computational and Applied Mathematics Reports.

Chen et al., Range Image Segmentation for Modeling and Object Detection in Urban Scenes. 2007, 3-D Digital Imaging and Modeling, Sixth International Conference on. IEEE.

Elaksher et al., Reconstructing 3D Buildings from Lidar Data, 2002, International Archives of Photogrammetry Remote Sensing and Spatial Information Sciences.

Hernandez et al., Filtering of Artifacts and Pavement Segmentation from Mobile LiDAR Data, 2009, ISPRS Workshop Laserscanning, Paris, France.

Hernandez et al., Point Cloud Segmentation Towards Urban Ground Modeling, 2009, IEEE.

Johnson et al., Using Spin Images for Efficient Object Recognition in Cluttered 3D Scenes, 1999, Pattern Analysis and Machine Intelligence IEEE.

Korah et al., Strip Histogram Grid for Efficient LIDAR Segmentation from Urban Environments, Jun. 2011, Computer Vision and Pattern Recognition Workshops, Computer Society Conference on IEEE.

Moosmann et al., Segmentation of 3D Lidar Data in Non-Flat Urban Environments Using a Local Convesity Criterion, 2009, Intelligent Vehicles Symposium.

Munoz et al., Directional Associative Markov Network for 3-D Point Cloud Classification, Jun. 2008, International Symposium on 3D Processing.

Nan et al., SmartBoxes for Interactive Urban Reconstruction, 2010, ACM Transactions on Graphics.

Wang et al., Lidar Data Segmentation and Classification Based on Octree Structure, 2004, Int. Archives of Photogrammetry and Remote Sensing.

Wang et al., A Hole-Filling Strategy for Reconstruction of Smooth Surfaces in Range Images, Oct. 12-15, 2003, Computer Graphics and Image Processing.

Zavodny et al., Region Extraction in Large-Scale Urban Lidar Data, 2009, Computer Vision Workshops, IEEE 12th International Conference on IEEE.

Zheng et al., Non-Local Scan Consolidation for 3D Urban Scenes, 2010, ACM Siggraph.

* cited by examiner

STRUCTURE DETERMINATION IN A GEOGRAPHIC AREA

BACKGROUND

The following disclosure generally relates to structure determination, and, more particularly, to determination of the locations of features or boundaries of structures in a geographic area.

Geographic mapping and modeling systems attempt to place structures in proper positions in a geographic area to accurately describe or depict the geographic area. Traditionally, determining the locations of structures is a labor intensive process of manually surveying a geographic area to determine precise locations for the boundaries of various structures. In geographic areas where there are numerous structures, such as metropolitan areas with many buildings, bridges, walls, and other structures, it may require significant resources to manually survey all structures to properly and accurately depict the geographic area.

SUMMARY

In an embodiment a method involves receiving a plurality of three dimensional (3D) data points representing a geographic area. The method also involves projecting the 3D data points into a two dimensional (2D) grid comprised of area elements. Further, the method involves determining a structure boundary based on an analysis of the area elements.

In an embodiment, an apparatus includes a memory configured to store 3D data points representing a geographic area. The apparatus also includes a processor configured to project the 3D data points into a 2D grid comprised of area elements. The processor may be further configured to determine a structure boundary based on an analysis of the area elements.

In an embodiment, a non-transitory computer readable medium including instructions that when executed on a computer are operable to receive a plurality of three 3D data points representing a geographic area. The instructions may be further operable to project the 3D data points into a 2D grid comprised of area elements, and determine a structure boundary based on an analysis of the area elements.

BRIEF DESCRIPTION OF THE DRAWINGS

Exemplary embodiments of the present invention are described herein with reference to the following drawings.

DETAILED DESCRIPTION OF THE PRESENTLY PREFERRED EMBODIMENTS

Data acquisition techniques, such as Light Detection and Ranging (LIDAR), may be used to develop three dimensional (3D) point clouds representing a geographic area and any structures included therein. 3D data points representing structures may be segmented from other 3D data points representing the geographic area using various techniques. In an embodiment, 3D LIDAR point cloud data is processed to determine values characterizing the individual 3D data points of the 3D LIDAR point cloud. The 3D data points may be projected into a two dimensional (2D) segmented plane. For example, each segment will contain all the 3D data points bounded by a vertical projection from the 2D segment. The characterizing values of the 3D data points in the 2D segment may be processed to develop composite characteristics for the 2D segment. The 2D segmented plane may then be processed to determine the locations of structure boundaries in the geographic area using the developed composite characteristics.

Determined locations of structure boundaries may be used in 3D models or representations of geographic areas to properly and accurately place structures within the context of the geographic area as represented in the 3D model. Structure boundary determination allows for large scale automatic 3D building and city modeling which is used in navigation, augmented reality, traffic simulation, survey and urban planning. As street level LIDAR data acquisition techniques may be used, concave and over-hanging structures may be modeled, wherein modeling these structures may have been difficult from previous techniques involving aerial data sources. Using LIDAR data, the accuracy and precision may be improved over aerial data reconstruction techniques due to high density and precision LIDAR. Also, LIDAR data may be used with aerial data. For example, a 3D building model may be completed using aerial data to model the building features or boundaries that are not visible from the ground level such as a building roof or a back of a building.

Figure 1:
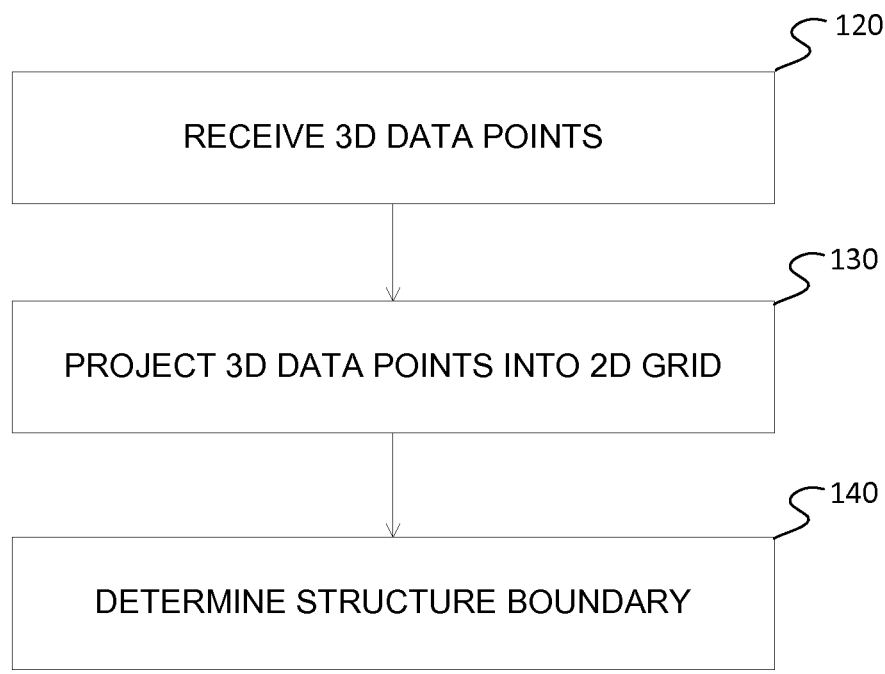
FIG. 1 is a diagram illustrating an embodiment for structure boundary determination.

FIG. 1 is a diagram illustrating an embodiment of a method for structure boundary determination. In an embodiment, the method may be implemented as computer program logic or computer readable program code stored in the memory and/or storage of a computer or system, such as the system 400 described below with respect to FIG. 4, and executable by one or more processors thereof to implement the disclosed functionality.

At act 120 a plurality of 3D data points representing a geographic area are received. The geographic area may be any geographic area. For example, the geographic area may be a metropolitan area with multiple structures such as Chicago, Ill. The geographic area represented may be any size. For example, the geographic area may be limited to an area surrounding a single structure, or the geographic area may be much larger and encompass an entire metropolitan area or region.

The 3D data points may be acquired using any data acquisition technique that is operable to represent a geographic area. In an embodiment, the 3D data points may be a point cloud acquired using LIDAR techniques. LIDAR, also known as LiDAR, Lidar, or other similar representations, is a remote sensing technology that measures distance by illuminating a target with a laser and analyzing the reflected light. Typically LIDAR uses ultraviolet, visible, or near infrared light to image objects and can be used with a wide range of targets. In an embodiment, a LIDAR data acquisition system may be attached or otherwise integrated with a vehicle. There may also be a positioning system integrated with the LIDAR vehicular system such as a Global Positioning System (GPS) to provide a base reference for the data acquired by the LIDAR system. The mobility of a vehicular system may facilitate acquiring data across a large geographic area using established positions for reference and integration of the acquired data into a point cloud representing the geographic area.

Pre-processing of acquired 3D data points may be required prior to further analysis. For example, 3D data points may be acquired in multiple sets through several LIDAR data acquisition sessions, and may need to be assembled into a unified point cloud on a common coordinate system for further processing. Multiple sets of 3D data points may be assembled into a unified point cloud using any registration technique. In an embodiment, a local registration technique is used between two sets of 3D data points. For example, Iterative Closest Point (ICP) techniques may be used to align the rotation and translation differences in the two 3D data point sets. ICP techniques may iteratively revise alignments or transformations to the 3D data point sets such that the distance, or measured difference, between the two 3D data point sets is minimized.

LIDAR point clouds may also undergo point cloud smoothing during pre-processing to minimize or remove 3D data points that do not accurately represent a geographic area, or structures in a geographic area. Any point cloud smoothing technique may be used. In an embodiment, a moving least squares technique is used to minimize a weighted least square error for each 3D data point of the point cloud.

At act 130 the 3D data points are projected into a two dimensional (2D) grid comprised of area elements. The 2D grid may involve any two dimensions of a three dimensional space. For example, for a space defined by an X-Y-Z coordinate system, the Z, or vertical, dimension may be removed leaving only the X and Y coordinate dimensions in the X-Y plane. The X-Y plane for the 2D grid may be placed at any position with respect to the Z axis. In an embodiment, a Z axis position corresponding with ground level for a structure is used.

The 2D grid may be composed of area elements of any size. Varying sizes may be used with different 3D data point sets or collections representing different geographic areas based on a resolution determined to suit the particular application. In an embodiment, the area elements may be sized to correspond to a graphical pixel size for a display of a 2D grid as a grid of displayed pixels.

Projecting the 3D data points into area elements of a 2D grid may be done by any method. In an embodiment involving a 3D orthogonal coordinate system, one of the dimensions, such as the vertical dimension, may be removed from the coordinate values for each 3D data point, thus leaving the 3D data points with only a 2D position description. The 2D boundaries for area elements may be defined based on the size of the area elements, and the projected 3D data points fitting within the 2D boundaries of an area element, may be considered to be in that area element. In this way, a type of histogram bin system may be created. Other projection techniques may be used as well.

At act 140 a structure boundary based on an analysis of the area elements is determined. A structure boundary may be the exterior surface, edge, or façade of a building, wall, or other manmade or natural structure.

The analysis may involve any analysis capable of recognizing structure boundaries. In an embodiment, the analysis involves the application of a machine learned model to the 2D grid of projected 3D data points. Any machine learned model, such as a support vector machine model (SVM), a random forests model, or a probabilistic graphical model, may be used. The machine learned model may be trained using 2D grids of known structure boundaries and 2D grids not containing structure boundaries to determine the characteristics of a structure boundary location in a 2D grid. The model may then be applied to the 2D grid of projected 3D data points representing a geographic area to determine the existence and position of building boundaries. For example, the area elements may be associated with a 3D data point density based on the number of 3D data points projected into an area element. The machine learned model may be trained to detect structure boundaries by detecting area element densities characteristic of structure boundaries.

Figure 2:
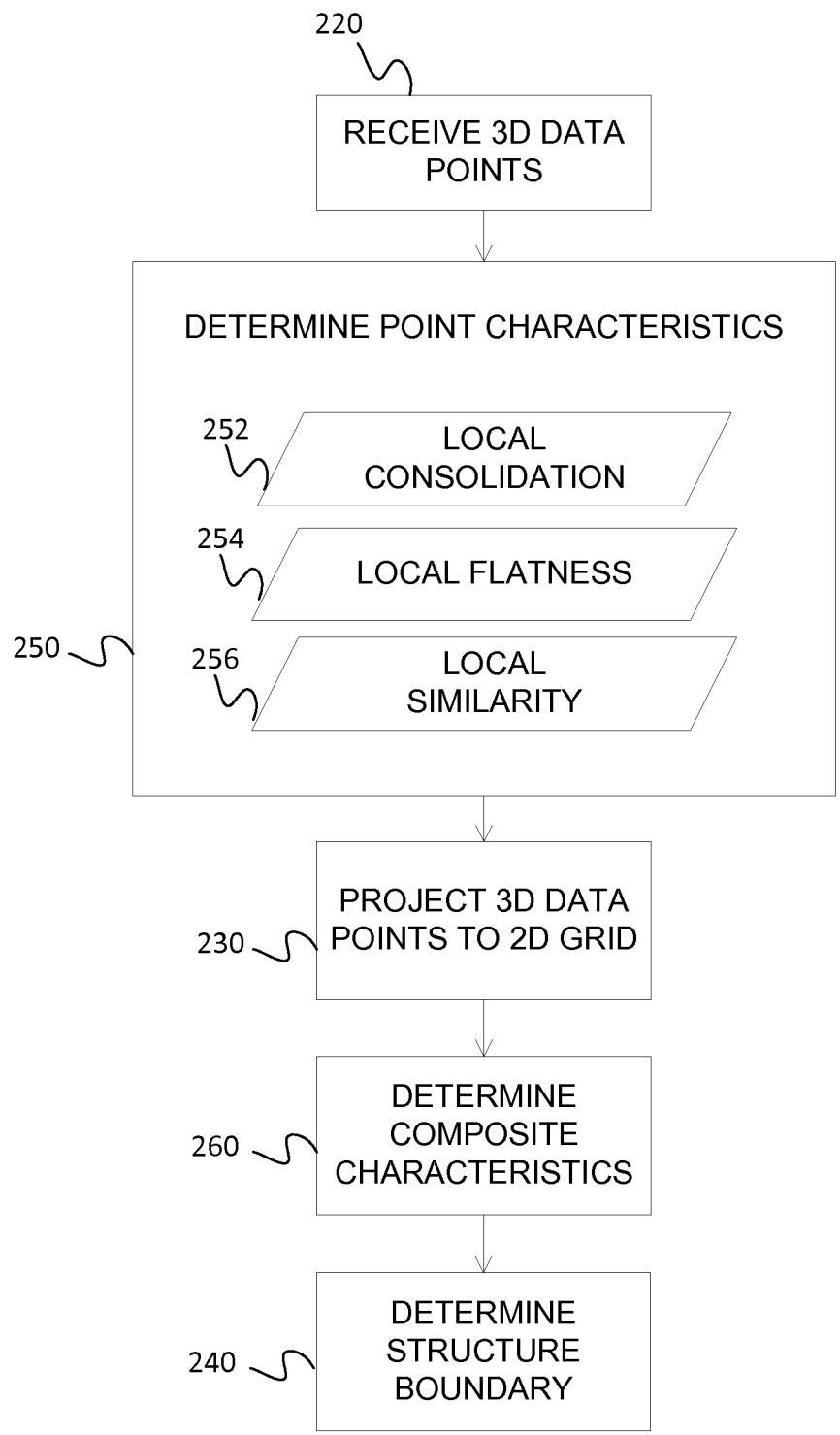
FIG. 2 is another diagram illustrating an embodiment for structure boundary determination.

FIG. 2 is another diagram illustrating a method for structure boundary determination. In an embodiment, the method may be implemented as computer program logic or computer readable program code stored in the memory and/or storage of a computer or system, such as the system 400 described below with respect to FIG. 4, and executable by one or more processors thereof to implement the disclosed functionality.

In act 220 a plurality of 3D data points representing a geographic area are received. In an embodiment, the 3D data points may be derived from data acquired through at least one LIDAR point cloud determination technique. The data may be received from any medium, device, or system capable of storing or transferring the plurality of 3D data points.

In act 250 point characteristics for the 3D data points may be determined. The point characteristics may be any characterizing feature of a 3D data point. In an embodiment, the point characteristics may be values determined for characteristics of the plurality of 3D data points. For example, a local consolidation value 252, a local flatness value 254, a local similarity value 256, or a height coordinate may be determined as characteristics for 3D data points.

In an embodiment, a local consolidation value 252 may be determined for 3D data points. A local consolidation value (ζ) 252 determined using Equation 1.

$$\zeta(v_i) = \frac{\sum_{0 \le j \le k} dist(S_i, v_{ij})}{k} \qquad \text{Equation 1}$$

Where ζ is a local consolidation value, $v_i$ is an individual 3D data point, $v_{ij}$ are 3D data points proximate to $v_i$, k is a number of $v_{ij}$ proximate to $v_i$, $S_i$ is a quadratic surface for the k number of $v_{ij}$, fit using a moving least squares algorithm, and $dist(S_i, v_{ij})$ is the distance from a particular $v_{ij}$ to the quadratic surface $S_i$. Generally, a consolidation value for a 3D data point may fall in a range from 0-1.

In an embodiment, a local flatness value 254 may be determined. A local flatness may be defined by measuring a standard deviation of dot products for normal vectors of 3D data points proximate to one another. For example, a 3D data point $v_i$ may have a normal denoted as $Nml(v_i)$. There may be k number of $v_{ij}$ proximate to $v_i$, wherein the average normal for the k number of $v_{ij}$ may be denoted as $Nml_{avg}(\hat{v}_i)$. For each $v_{ij}$, the dot product between $Nml(v_i)$ and $Nml_{avg}(\hat{v}_i)$ is denoted as $<Nml(v_i), Nml_{avg}(\hat{v}_i)>$. Then for 3D data point $v_i$, the local flatness value 254 is computed as a standard deviation over all $<Nml(v_i), Nml_{avg}(\hat{v}_i)>$ for its neighbors $y_{ij}$.

In an embodiment, a local similarity value 256 may be determined. A local similarity may be defined by measuring a deviation of patterns of 3D data points in a proximate area. A pattern may be determined using any technique. For example, a local pattern may be determined using 3D data points normal to a 3D data point, or through the creation of a spin image.

Defining a pattern by 3D data points normal to a 3D data point a bounding sphere with radius of $\alpha$ around a 3D data point $v_i$ is constructed. The sphere is then divided into three spherical layers denoted as [$l_i$, $0 \leq i \leq 2$], where the origin of $l_0$ is at $v_i$ and the radius of $l_0$ is $$\frac{\alpha}{3},$$

the outer radius of $l_1$ is $$\frac{2\alpha}{3}$$

and the inner radius of $l_1$ is $$\frac{\alpha}{3},$$

and the outer radius of $l_2$ is $\alpha$ and the inner radius of $l_2$ is $$\frac{2\alpha}{3}.$$

The collection of all points proximate to $v_i$ that fall into a particular layer $l_i$ are denoted as $V_{l_i}$, which may be considered a pattern. Pattern similarities between the patterns formed in the layers may be determined through any method.

In an embodiment, a Hausdorff distance may be used to determine a quantity representing a similarity between the layer patterns. A local similarity of 3D data point $v_i$ may be defined as a mean or average of Hausdorff distances between the points normal of 3D data points of each layer. In an embodiment having three layers, three Hausdorff distances may be calculated. The three Hausdorff distances may be denoted as $H(Nml(V_{l_0}), Nml(V_{l_1}))$, $H(Nml(V_{l_0}), Nml(v_{l_2}))$, and $H(Nml(V_{l_1}), Nml(V_{l_2}))$. Where a Hausdorff distance between two sets, A and B may be defined as $H(A,B)=\max(h(A,B),h(B,A))$, where $$h(A, B) = \max_{a \in A} \left\{ \min_{b \in B} \{d(a, b)\} \right\} \text{ and}$$

$$h(B, A) = \max_{b \in B} \left\{ \min_{a \in A} \{d(b, a)\} \right\}.$$

The distance $d(\alpha,b)$ may be defined as $1-<Nml(\alpha), Nml(b)>$. The local similarity value ($\xi$) 256 may then be calculated using Equation 2.

$$\xi(v_i) = \frac{\sum_{1 \leq i,j \leq 3} H(Nml(V_{l_i}), Nml(V_{l_j}))}{3} \quad \text{Equation 2}$$

Another technique for determining patterns may be through the creation of a spin image. In spin image creation, a 3D data point $v_i$ may have an associated direction, which may be a direction normal $n_i$ to a proximate point. With $v_i$ and $n_i$ defined, a 2D basis $(v_i, n_i)$ equates to a cylindrical coordinate system $(\alpha, \beta)$ where $\alpha$ is a perpendicular distance to a plane tangent to $v_i$, where $\beta$ is the signed perpendicular distance to $v_i$. The oriented point $v_i$ is then used to generate a spin map $S_O$. A spin map may be expressed as a projection function of 3D coordinates x of an object to 2D coordinates of the cylindrical system $(\alpha, \beta)$ associated with the 2D basis $(v_i, n_i)$ that corresponds to the oriented 3D data point $v_i$. Spin projections may be given by Equation 3.

$$S_O(x) \rightarrow (\alpha, \beta) = (\sqrt{\|x-v_i\|^2 - (n_i \cdot (x-v_i))^2}, n_i \cdot (x-v_i)) \quad \text{Equation 3}$$

In generating a spin image for the 3d data points of a point cloud, a distribution of 3D data points around a 3D data point of interest is defined. A 2D histogram of the distribution may be presented in the form of a grayscale image. The difference of the spin images of two points may then be considered the difference of the two probability distributions. Any technique may be used to determine the difference of the two probability distributions. In an embodiment, an Earth Mover's Distance (EMD) technique may be used. For example, a local similarity value for a 3D data point with respect to other proximate 3D data points may be the average of the differences in the respective 3D data points' spin image EMD values.

In act 230 3D data points are projected into a 2D grid comprised of area elements. The area elements may be any type or size of 2D elements. The size of the area elements may be adjustable to increase the resolution and distinction of the 3D data point projections into the 2D grid. For example, smaller area elements may better define structure boundaries to a more accurate location than larger area elements because of an increase in resolution of the 2D grid.

In act 260 composite characteristics may be determined from the point characteristics for 3D data points projected into each element. The composite characteristics may be determined using any cumulative or statistical technique for determining composite values for the characteristics. For example, a composite characteristic may be a mean, mode, or average of the values of the 3D data points projected into an area element.

In act 240 a structure boundary is determined based on an analysis of the area elements. The analysis may involve the application of a machine learned model to the 2D grid of area elements. In an embodiment, the machine learned model is trained to use the composite characteristics determined in act 260 to determine structure boundaries. The machine learned model may be trained on 2D grids having known structure boundaries involving certain area element characteristics. A 2D grid of a geographic area may have the same types of area element characteristics as the training models such that the machine learned model may detect structure boundaries based on recognized area element characteristics that indicate the existence and location of a structure boundary. Multiple area element characteristics may be used in an analysis. For example, composite area element local consolidation values, composite area element local flatness values, composite area element local similarity values, or any combination thereof, may be used in an analysis to determine structure boundaries. In an embodiment, a composite area element characteristic may be the average height of all the 3D data points in the area element.

3D data point characteristics and element characteristics as analyzed and presented herein may indicate other features of structures as well as boundaries. For example, an analysis of determined element characteristics may indicate that there are windows at a particular location, or a recessed entryway. In an embodiment, element characteristics may indicate differences between man-made structures, such as buildings, and natural structures, such as trees. For example, element characteristics such as local flatness may be indicative of a difference between a building and a tree.

Figure 3:
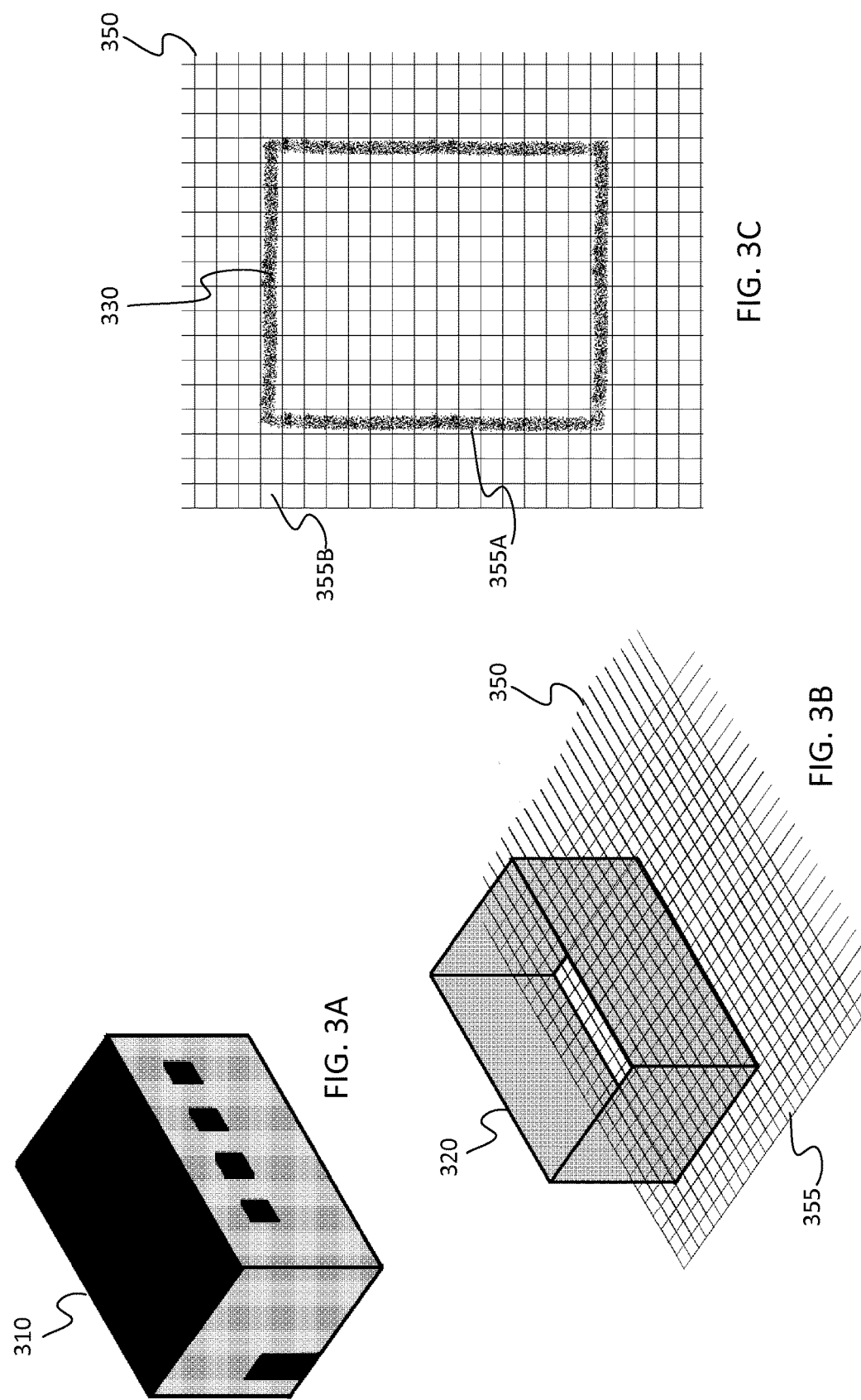
FIG. 3A depicts a structure in a geographic area.
FIG. 3B depicts three dimensional (3D) data points representing the structure in the geographic area of FIG. 3A.
FIG. 3C depicts projections of 3D data points into a two dimensional (2D) grid.

FIGS. 3A-3C depict a 2D grid creation for structure determination using a collection of 3D data points.

FIG. 3A depicts a structure 310 in a geographic area. 3D data points representing the geographic area may be acquired through data acquisition techniques such as LIDAR. LIDAR data may be taken from all sides of the structure 310. The LIDAR data from all four sides of the structure 310 may be combined onto a common coordinate system to form a unified LIDAR point cloud representing the structure 310 and the geographic area the structure in which the structure is located. FIG. 3B depicts 3D data points 320 from the LIDAR point cloud representing the structure 310 in the geographic area of FIG. 3A. A 2D grid 350 of area elements 355 may be overlaid on the point cloud common coordinate system. In this embodiment, the 2D grid 350 is placed on a vertical plane representing ground level of the geographic area. FIG. 3C depicts 3D data point projections 330 into the 2D grid 350 of area elements 355. Note that the interior of the data point projections 330 is absent 3D data points. This is because LIDAR systems typically acquire data using laser technology that has difficulty penetrating materials from which many structures are made. The 2D grid 350 containing 3D data point projections 330 into area elements 355 may be analyzed to determine structure boundaries. For example, an analysis may yield that an area element 355A may contain a structure boundary. The analysis may also yield that another area element 355B does not contain a structure boundary. From the analysis, it may be determined that the location of area element 355A is a location of a structure boundary.

Figure 4:
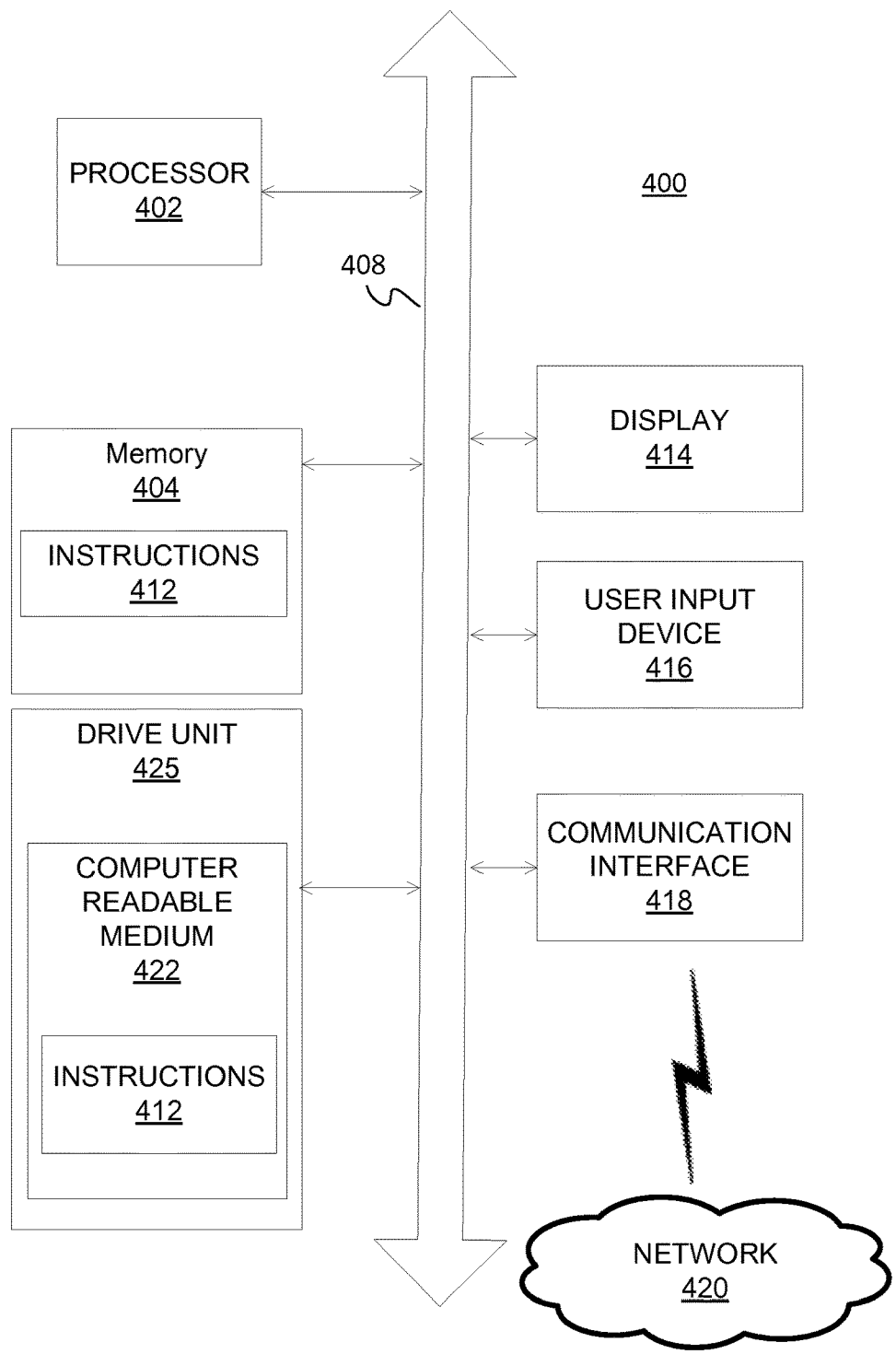
FIG. 4 depicts a system for structure boundary determination.

FIG. 4 provides an illustrative embodiment of a general computer system 400 for structure boundary determination. The computer system 400 can include a set of instructions that can be executed to cause the computer system 400 to perform any one or more of the methods or computer based functions disclosed herein. The computer system 400 may operate as a standalone device or may be connected, e.g., using a network, to other computer systems or peripheral devices. Any of the embodiments discussed above may be implemented using the computer system 400 or a component in the computer system 400.

In a networked deployment, the computer system 400 may operate in the capacity of a server or as a client user computer in a client-server user network environment, or as a peer computer system in a peer-to-peer (or distributed) network environment. The computer system 400 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 400 can be implemented using electronic devices that provide voice, video or data communication. Further, while a single computer system 400 is illustrated, the term "system" shall also be taken to include any collection of systems or sub-systems that individually or jointly execute a set, or multiple sets, of instructions to perform one or more computer functions.

As illustrated in FIG. 4, the computer system 400 may include a processor 402, e.g., a central processing unit (CPU), a graphics processing unit (GPU), or both. The processor 402 may be a component in a variety of systems. For example, the processor 402 may be part of a standard personal computer or a workstation. The processor 402 may be one or more general processors, digital signal processors, application specific integrated circuits, field programmable gate arrays, servers, networks, digital circuits, analog circuits, combinations thereof, or other now known or later developed devices for analyzing and processing data. The processor 402 may implement a software program, such as code generated manually (i.e., programmed). In an embodiment, the processor 402 may be configured to project 3D data points into a 2D grid comprised of area elements, and determine a structure boundary based on an analysis of the area elements.

The computer system 400 may include a memory 404 that can communicate via a bus 408. The memory 404 may be a main memory, a static memory, or a dynamic memory. The memory 404 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one embodiment, the memory 404 includes a cache or random access memory for the processor 402. In alternative embodiments, the memory 404 is separate from the processor 402, such as a cache memory of a processor, the system memory, or other memory. The memory 404 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 404 is operable to store instructions executable by the processor 402. The functions, acts or tasks illustrated in the figures or described herein may be performed by the programmed processor 402 executing the instructions 412 stored in the memory 404. The functions, acts or tasks are independent of the particular type of instructions set, storage media, processor or processing strategy and may be performed by software, hardware, integrated circuits, firmware, microcode and the like, operating alone or in combination. Likewise, processing strategies may include multiprocessing, multitasking, parallel processing and the like. In an embodiment, the memory 404 may be configured to store 3D data points representing a geographic area.

As shown, the computer system 400 may further include a display unit 414, such as a liquid crystal display (LCD), an organic light emitting diode (OLED), a flat panel display, a solid state display, a cathode ray tube (CRT), a projector, a printer or other now known or later developed display device for outputting determined information. The display 414 may act as an interface for the user to see the functioning of the processor 402, or specifically as an interface with the software stored in the memory 404 or in the drive unit 406. In an embodiment, the display 414 may be operational to display a representation of a geographic area using 3D data points taken from the geographic area. The display 414 may also be operational to display a representation of determined structure boundaries.

Additionally, the computer system 400 may include an input device 416 configured to allow a user to interact with any of the components of system 400. The input device 416 may be a number pad, a keyboard, or a cursor control device, such as a mouse, or a joystick, touch screen display, remote control or any other device operative to interact with the system 400.

In a particular embodiment, as depicted in FIG. 4, the computer system 400 may also include a disk or optical drive unit 406. The disk drive unit 406 may include a computer-readable medium 410 in which one or more sets of instructions 412, e.g. software, can be embedded. Further, the instructions 412 may embody one or more of the methods or logic as described herein. In a particular embodiment, the instructions 412 may reside completely, or at least partially, within the memory 404 and/or within the processor 402 during execution by the computer system 400. The memory 404 and the processor 402 also may include computer-readable media as discussed above.

The present disclosure contemplates a computer-readable medium that includes instructions 412 or receives and executes instructions 412 responsive to a propagated signal, so that a device connected to a network 420 can communicate voice, video, audio, images or any other data over the network 420. Further, the instructions 412 may be transmitted or received over the network 420 via a communication interface 418. The communication interface 418 may be a part of the processor 402 or may be a separate component. The communication interface 418 may be created in software or may be a physical connection in hardware. The communication interface 418 is configured to connect with a network 420, external media, the display 414, or any other components in system 400, or combinations thereof. The connection with the network 420 may be a physical connection, such as a wired Ethernet connection or may be established wirelessly as discussed below. Likewise, the additional connections with other components of the system 400 may be physical connections or may be established wirelessly. In an embodiment, 3D data points representing a geographic area may be received by the communication interface 418 via the network 420.

The network 420 may include wired networks, wireless networks, or combinations thereof. The wireless network may be a cellular telephone network, an 802.11, 802.16, 802.20, or WiMax network. Further, the network 420 may be a public network, such as the Internet, a private network, such as an intranet, or combinations thereof, and may utilize a variety of networking protocols now available or later developed including, but not limited to TCP/IP based networking protocols.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a computer readable medium for execution by, or to control the operation of, data processing apparatus. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein. The computer readable medium can be a machine-readable storage device, a machine-readable storage substrate, a memory device, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the present specification describes components and functions that may be implemented in particular embodiments with reference to particular standards and protocols, the invention is not limited to such standards and protocols. For example, standards for Internet and other packet switched network transmission (e.g., TCP/IP, UDP/IP, HTML, HTTP, HTTPS) represent examples of the state of the art. Such standards are periodically superseded by faster or more efficient equivalents having essentially the same functions. Accordingly, replacement standards and protocols having the same or similar functions as those disclosed herein are considered equivalents thereof.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and anyone or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a device having a display, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings and described herein in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

It is therefore intended that the foregoing detailed description be regarded as illustrative rather than limiting, and that it be understood that it is the following claims, including all equivalents, that are intended to define the spirit and scope of this invention.

We claim:

1. A method for using a boundary of a physical structure in a geographic area for performing at least one of a navigation function, augmented reality function, or traffic simulation function comprising depicting a representation of the geographic area via a display unit, comprising implementing by a programmed computer system (a) comprising (i) a processor and (ii) a communication interface configured to communicate via at least one network, (b) controlled by executable machine readable instructions, and (c) in communication with a mobile device comprising the display unit the steps of:
   receiving, via the communication interface, a plurality of three dimensional (3D) data points representing the geographic area;
   generating a projection of the 3D data points onto a two dimensional (2D) grid comprised of area elements, the area elements sized to correspond to a graphical pixel size of the display unit;
   determining point characteristics for the 3D data points, wherein (a) the area elements comprise composite characteristics determined from the point characteristics for 3D data points projected into each element and (b) a point characteristic characterizes a feature of a 3D data point;
   determining the boundary of the physical structure based on an analysis of the composite characteristics of the area elements: and
   providing the boundary of the physical structure to the mobile device, wherein the mobile device performs at least one of a (a) navigation function, (b) augmented reality function, or (c) traffic simulation function based on the boundary of the physical structure, wherein performing the at least one of the (a) navigation function, (b) augmented reality function, or (c) traffic simulation function comprises displaying, by the display unit of the mobile device, at least a portion of the boundary of the physical structure as part of a representation of the geographic area,
   wherein the point characteristics comprise a local flatness value determined through a measurement of a standard deviation of dot products of normal vectors of individual 3D data points proximate to each other to the average normal vector for the individual 3D data points proximate to each other.

2. The method of claim 1, wherein the structure is a building, and the boundary is a facade of the building.

3. The method of claim 1, wherein the plurality of 3D data points is derived from data acquired through at least one Light Detection and Ranging (LIDAR) point cloud determination technique.

4. The method of claim 1, wherein the point characteristics further comprise a local consolidation value ($\zeta$) determined as:

$$\zeta(v_i) = \frac{\sum_{0 \le j \le k} dist(S_i, v_{ij})}{k}$$

wherein:
   $v_i$ is an individual 3D data point;
   $v_{ij}$ are 3D data points proximate to $v_i$;
   k is a number of $v_{ij}$ proximate to $v_i$;
   $S_i$ is a quadratic surface for the k number of $v_{ij}$, fit using a moving least squares algorithm; and
   $dist(S_i, v_{ij})$ is the distance from a particular $v_{ij}$ to the quadratic surface $S_i$.

5. The method of claim 1, wherein the point characteristics comprise a local similarity value determined as a measurement of similarities of patterns of proximate 3D data points to a particular 3D data point.

6. The method of claim 1, wherein the analysis comprises a machine learned model.

7. The method of claim 6, wherein the machine learned model comprises a support vector machine model (SVM), a random forests model, or a probabilistic graphical model.

8. The method of claim 1, further comprising:
   preprocessing the 3D data points prior to projecting the 3D data points to the 2D grid.

9. The method of claim 1, wherein the plurality of 3D data points comprises multiple 3D data point sets acquired from different views of the geographic area.

10. An apparatus comprising:
   a non-transitory computer-readable medium having (a) three dimensional (3D) data points representing a geographic area and (b) computer-executable code stored thereon;
   a communication interface configured to communicate via at least one network; and a processor, wherein when the processor processes the computer-executable code, the apparatus:
   generates a projection of the 3D data points onto a two dimensional (2D) grid comprised of area elements, the area elements sized to correspond to a graphical pixel size of a display unit of a mobile device in communication with the apparatus, determines point characteristics for the 3D data points, wherein (a) a point characteristic characterizes a feature of a 3D data point and (b) the area elements comprise composite characteristics determined from the point characteristics for 3D data points projected into each element, determines the boundary of the physical structure based on an analysis of the composite characteristics of the area elements, and provides the boundary of the physical structure to the mobile device, wherein the mobile device performs at least one of a (a) navigation function, (b) augmented reality function, or (c) traffic simulation function based on the boundary of the physical structure, wherein performing the at least one of the (a) navigation function, (b) augmented reality function, or (c) traffic simulation function comprises displaying, by the display unit of the mobile device, at least a portion of the boundary of the physical structure as part of a representation of the geographic area, wherein the point characteristics comprise a local flatness value determined through a measurement of a standard deviation of dot products of normal vectors of individual 3D data points proximate to each other to the average normal vector for the individual 3D data points proximate to each other.

11. The apparatus of claim 10, wherein the plurality of 3D data points is derived from data acquired through at least one Light Detection and Ranging (LIDAR) point cloud determination technique.

12. The apparatus of claim 10, wherein the analysis comprises a machine learned model selected from the group consisting of a support vector machine model (SVM), a random forests model, and a probabilistic graphical model.

13. A non-transitory computer readable medium including instructions that when executed on a computer are operable to:

receive a plurality of three dimensional (3D) data points representing a geographic area;

generate a projection of the 3D data points onto a two dimensional (2D) grid comprised of area elements, the area elements sized to correspond to a graphical pixel size of a display unit of a mobile device in communication with the computer;

determine point characteristics for the 3D data points, wherein (a) the area elements comprise composite characteristics determined from the point characteristics for 3D data points projected into each element and (b) a point characteristic characterizes a feature of a 3D data point;

determine a boundary of a physical structure based on an analysis of the composite characteristics of the area elements: and provide the boundary of the physical structure to the mobile device, wherein the mobile device performs at least one of a (a) navigation function, (b) augmented reality function, or (c) traffic simulation function based on the boundary of the physical structure, wherein performing the at least one of the (a) navigation function, (b) augmented reality function, or (c) traffic simulation function comprises displaying, by the display unit of the mobile device, at least a portion of the boundary of the physical structure as part of a representation of the geographic area, wherein the point characteristics for a particular point comprise a local flatness value determined through a measurement of a standard deviation of dot products of normal vectors of individual 3D data points proximate to each other to the average normal vector for the individual 3D data points proximate to each other.

14. The medium of claim 13, wherein the plurality of 3D data points is derived from data acquired through at least one LIDAR point cloud determination technique.

15. The medium of claim 13, wherein the point characteristics are selected from the group consisting of a local consolidation value, a local flatness value, a local similarity value, a height value, and combinations thereof, and wherein the analysis comprises a machine learned model selected from the group consisting of a support vector machine model (SVM), a random forests model, and a probabilistic graphical model.

16. The method of claim 4, wherein the structure is a building, and the boundary is a facade of the building.

17. The method of claim 4, wherein the plurality of 3D data points is derived from data acquired through at least one Light Detection and Ranging (LIDAR) point cloud determination technique.

* * * * *